United States Patent [19]

Stevens et al.

[11] Patent Number: 4,538,171
[45] Date of Patent: Aug. 27, 1985

[54] HIGH POWER SEMICONDUCTOR HEAT SINK ASSEMBLY

[75] Inventors: Keith D. Stevens; John Harrison; Stanley B. Kaye, all of Stockport, England

[73] Assignee: Cableform Limited, England

[21] Appl. No.: 310,255

[22] Filed: Oct. 9, 1981

[30] Foreign Application Priority Data

Oct. 30, 1980 [GB] United Kingdom ............... 8034892
Jun. 5, 1981 [GB] United Kingdom ............... 8117292

[51] Int. Cl.³ .................... H01L 23/02; H01L 23/32; H01L 23/42
[52] U.S. Cl. ........................... 357/81; 357/76; 357/79
[58] Field of Search ............... 357/81, 76, 79

[56] References Cited

U.S. PATENT DOCUMENTS

| | | | |
|---|---|---|---|
| 2,461,087 | 2/1949 | Sell et al. | 357/81 |
| 2,825,014 | 2/1958 | Willemse | 357/79 |
| 3,264,531 | 8/1966 | Dickson, Jr. | 357/81 |
| 3,373,335 | 3/1968 | Rosenberg | 357/76 |
| 3,437,887 | 4/1969 | Nowalk et al. | 357/79 |
| 3,443,168 | 5/1969 | Camp et al. | 357/79 |
| 3,651,383 | 3/1972 | Livezey et al. | 357/81 |
| 4,099,201 | 7/1978 | Mueller | 357/79 |
| 4,326,238 | 4/1982 | Takeda et al. | 357/81 |

FOREIGN PATENT DOCUMENTS

| | | | |
|---|---|---|---|
| 53-72465 | 6/1978 | Japan | 357/81 A |
| 277111-5 | 7/1970 | U.S.S.R. | 357/79 |

OTHER PUBLICATIONS

"Replaceable Chip to Heat Sink Connection on Circuit Boards", W. E. Dunkel, *IBM Technical Disclosure Bulletin*, vol. 14, No. 11, Apr. 1972, p. 3332.

*Primary Examiner*—Andrew J. James
*Assistant Examiner*—John Lamont
*Attorney, Agent, or Firm*—Sughrue, Mion, Zinn, Macpeak, and Seas

[57] ABSTRACT

A high power semiconductor heat sink assembly comprising a semiconductor slice or chip and a heat sink structure. The heat sink structure comprises two spaced apart thermally and electrically conductive plates of for example aluminum between which the slice or chip is clamped. A device such as an O-ring is sandwiched between the plates so as to extend around the slice or chip and define a sealed compartment within which the slice or chip is located. An electrically non-conductive thermally conductive material such as a resin comprising alumina fills the space between the plates outside the compartment.

12 Claims, 1 Drawing Figure

U.S. Patent
Aug. 27, 1985
4,538,171
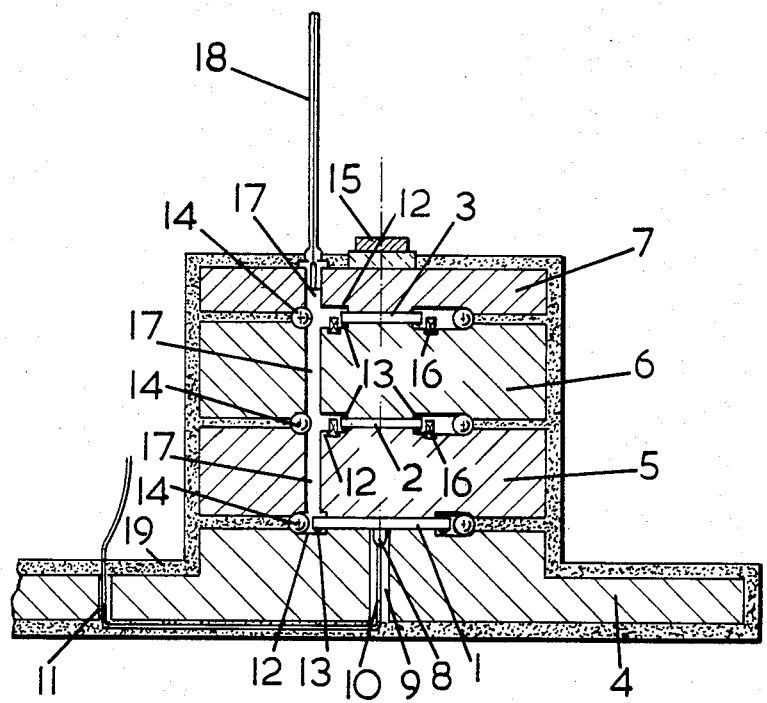

HIGH POWER SEMICONDUCTOR HEAT SINK ASSEMBLY

The present invention relates to high power semiconductor heat sink assemblies.

High power semiconductor devices must be mounted on heat sinks which are capable of dissipating large quantities of energy in the form of heat if they are to operate effectively and without undue shortening of their operational life. To this end the semiconductor chips or slices comprising the device are usually mounted within a metal case. In conventional high power semiconductor devices the semiconductor slice is mounted on an inside surface of the case and the case is filled with a protective gas to ensure maximum stability of the slice.

The heat dissipation characteristics of the known devices are inadequate. These characteristics could be improved if the slice were encapsulated in a heat conductive electrically insulating material so that heat could be rapidly dissipated from both sides of the slice. It would however be necessary to ensure that the heat conductive material and the slice did not interact. Thus a passivation layer would have to be formed over the exposed surface of the slice prior to encapsulation with the heat conductive material.

The most suitable heat conductive material is an epoxy resin filled with a heat conductive material. The use of an epoxy resin would mean in practice that the slice must be protected by a glass passivation layer. The techniques of glass passivation are well known but glass passivated high power seniconductor devices are very expensive when compared with similar devices which have not been glass passivated.

It is an object of the present invention to provide a high power semiconductor heat sink assembly in which the need to protect the slice from the heat conductive material by glass passivation is avoided.

According to the present invention, there is provided a high power semiconductor heat sink assembly comprising a semiconductor slice or chip and a heat sink structure, characterised in that the heat sink structure comprises two spaced apart thermally and electrically conductive plates between which the slice or chip is clamped, means sandwiched between the plates and extending around the slice or chip to define a sealed compartment within which the slice or chip is located, and an electrically non-conductive thermally conductive material which fills the space between the plates outside said compartment.

The invention also provides a method of manufacturing a high power semiconductor heat sink assembly comprising a semiconductor slice or chip and a heat dissipating structure, characterised in that the semiconductor slice or chip is placed on a first thermally and electrically conductive plate, sealing means are placed on the plate so as to surround the slice or chip, a second plate is secured over the first in spaced apart relation thereto so that the slice or chip is clamped between the two plates and so that the means extending around the slice or chip defines a sealed compartment within which the slice or chip is located, and the space between the two plates outside the compartment is filled with electrically non-conductive, but thermally conductive material.

The plates may be of aluminium, and the heat conducting material may be a resin comprising 80% alumina. The sealed compartment may be defined by a rubber O-ring sandwiched between the two plates.

Preferably a passage extends through at least one of the plates to communicate with the compartment to enable the evacuation and subsequent sealing of the compartment.

A protective gas such as nitrogen may be injected into the compartment after evacuation and prior to the closure of the passage.

An embodiment of the present invention will now be described by way of example with reference to the accompanying drawing.

In the drawing there is shown a high power semiconductor device consisting of a thyristor slice 1 and the two diode slices 2 and 3. Each semiconductor slice 1, 2 and 3 is respectively sandwiched between aluminium heat sink plates 4 and 5, 5 and 6, and 6 and 7. The semiconductor slices 1, 2 and 3 are connected together in series through the aluminium heat sinks 4, 5, 6 and 7 and therefore where necessary connections can be made to the slices directly through the aluminium heat sinks 4, 5, 6 and 7, except in the case of the gate contact 8 of the thyristor slice 1. To allow a connection to be made to the gate 8 a hole 9 is provided through aluminium heat sink 4. A gate lead 10 passes through the hole 9, along the underside of plate 4, and through a further hole 11 in the plate to the exterior of the device. The hole 9 is sealed to prevent contamination of the underside of the slice 1.

Each slice 1, 2 and 3 is suitably prepared for seating against the aluminium heat sinks 4, 5, 6 and 7 by providing metalised contacting surfaces which are passivated in accordance with known techniques. Thin silver and molybdenum washers (not shown) are placed between the slices and the adjacent plates. The surfaces of the aluminium heat sinks 4, 5, 6 and 7 which are to seat the slices 1, 2 and 3 are also prepared. The seating surfaces are pressed flat and parallel and shallow grooves 12 are pressed into the heat sink surface around the seating surfaces to provide clearance for passivation beads 13 protruding from the edges of the slices. To effect sealing of each slice 1, 2 and 3 rubber O-rings 14 are used to surround but not contact the slices. Contact between the slices and the rings 14 could adversely affect the passivation layers of the slices. The whole assembly is then tightly clamped together with a clamp (not shown) acting on a bar 15 to force together plates 4 and 7. Clamping the assembly together ensures that the surfaces of the slices 1, 2 and 3, and the heat sinks 4, 5, 6 and 7 are in good contact and that the rubber O-rings 14 are sufficiently compressed to provide an effective seal.

The large slice 1 is self-locating as its gate lead 10 must be passed through the hole 9. The smaller slices 2 and 3 are not self-locating however and therefore PTFE rings 16 are loosely placed in grooves to act as locators for the slices. Any contact between the slices and the rings 16 is so light that the slice cannot be mechanically damaged and PTFE has no adverse effect on the passivation of the slices. Each of the plates 5, 6 and 7 has a passage 17 therethrough, the passage communicating with the grooves 12. The end of the passage 17 in the plate 7 receives a plug communicating with an evacuation tube 18, the tube 18 thus communicating with the annular spaces defined between the slices and the O-rings.

The tightly clamped assembly is then encapsulated in an epxoy resin 19 which has a high thermal conductivity but which is electrically non-conductive. The epoxy resin may be filled with 80% alumina. The resin is applied to the assembly under vacuum so that a complete seal and isolating barrier is obtained between each adjacent pair of heat sinks. The high thermal conductivity of the epoxy resin ensures that the heat sinks 4, 5, 6 and 7 function as one single heat dissipating mass, whilst the component heat sink plates are still electrically isolated from each other. As a result even if only the aluminium heat sink 4 is clamped to the chassis of the apparatus in which the device is to be used heat is still conducted away from heat sinks 5, 6 and 7. Further because of the epoxy resin coating 19 no additional insulating means is required to be provided between the device and the apparatus chassis.

The provision of the rubber O-rings 14 seals each slice 1, 2 and 3 from the epoxy resin 19, which means that the passivation of each slice 1, 2 and 3 does not have to cope with the epoxy resin 19. Therefore expensive glass passivation is not required.

Either before or after the epoxy resin 19 has been applied, the annular spaces between the O-rings 14 and the slices are evacuated via passage 17 and tube 18. After evacuation, the evacuated space is filled with a protective gas such as nitrogen and the tube 18 is sealed. The slices are thus isolated in a protective gas atmosphere enclosed within a robust assembly, ideal conditions for obtaining high reliability.

It will be appreciated that any number of slices or chips may be assembled together in a high power semiconductor device of the above type. Further it will be appreciated that where necessary the slices or chips in one assembly may be electrically isolated from each other by providing an electrically insulating layer of resin between adjacent subassemblies. It will also be appreciated that whilst the embodiment described herein comprises a thyristor and two diodes other types of semiconductor devices and different combinations thereof may be used.

What is claimed is:

1. A high power semiconductor heat sink assembly comprising: a semiconductor chip; two spaced apart thermally and electrically conductive rigid heat sink plates having substantially parallel facing planar surfaces between which a space is defined and between which the semiconductor chip is clamped so that the width of the space is substantially the same as the width of the chip, the thickness of each plate being substantially greater than the thickness of the space between them, and the facing surfaces of the plates extending a substantial distance beyond the edges of the chip so that a substantial proportion of the space defined between the plates is not occupied by the chip; resilient sealing means sandwiched between the plates and extending around the chip to define with said plates a sealed compartment within which the chip is located; and a thin layer of a solid, electrically nonconductive, thermally conductive material filling the space between the plates outside said compartment, the area of each plate surface in contact with said material being substantially larger than the area of each plate surface in contact with the chip, whereby heat can be rapidly conducted away from the chip through the plates and from one plate to the other.

2. A heat sink assembly according to claim 1, wherein the plates are of aluminium.

3. A heat sink assembly according to claim 1 or 2, wherein the thermally conductive material is a resin.

4. A heat sink assembly according to claim 3, wherein the resin is filled with 80% alumina.

5. A heat sink assembly according to claim 1, wherein the means sandwiched between the two plates and defining a sealed compartment is a rubber O-ring.

6. A heat sink assembly according to preceding claim 1, wherein a plurality of semiconductor chips are provided, each chip being clamped between a respective pair of plates.

7. A heat sink assembly according to claims 1 or 2, comprising a plurality of semiconductor chips, more than one chip being clamped between one pair of plates.

8. A heat sink assembly according to claim 1, wherein the semiconductor chip is located within a locator ring received in a groove in an adjacent plate.

9. A heat sink assembly according to claim 8, wherein the ring is of polytetrafluoroethylene.

10. A heat sink assembly according to claim 1, wherein the thermally conductive material encapsulates the plates.

11. A heat sink assembly according to claim 1, wherein a passage extends through at least one of the plates to communicate with the compartment, the passage being sealed to prevent any leakage of gas into or out of the compartment.

12. A heat sink assembly according to claim 11, wherein the compartment is filled with a protective gas.

* * * * *